United States Patent
Doi et al.

(10) Patent No.: US 9,263,482 B2
(45) Date of Patent: Feb. 16, 2016

(54) SOLID-STATE IMAGE PICKUP DEVICE

(71) Applicant: PANASONIC CORPORATION, Osaka (JP)

(72) Inventors: Hiroyuki Doi, Toyama (JP); Mitsuo Yasuhira, Osaka (JP); Ryohei Miyagawa, Kyoto (JP); Yoshiyuki Ohmori, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/142,646

(22) Filed: Dec. 27, 2013

(65) Prior Publication Data

US 2014/0117486 A1     May 1, 2014

Related U.S. Application Data

(63) Continuation of application No. PCT/JP2012/004166, filed on Jun. 27, 2012.

(30) Foreign Application Priority Data

Jun. 30, 2011    (JP) .................................. 2011-145774

(51) Int. Cl.
    *H01L 27/146*      (2006.01)

(52) U.S. Cl.
    CPC .... *H01L 27/14603* (2013.01); *H01L 27/14621* (2013.01); *H01L 27/14623* (2013.01); *H01L 27/14665* (2013.01)

(58) Field of Classification Search
    CPC .......................... H01L 27/14638; H04N 5/335
    USPC .................. 257/292, 436, 462, 448; 348/294
    See application file for complete search history.

(56) References Cited

U.S. PATENT DOCUMENTS 6,969,899 B2 * 11/2005 Yaung ................. H01L 27/1462
                                                    257/431
7,897,426 B2 * 3/2011 Maehara ............. H01L 27/1462
                                                    438/69

(Continued)

FOREIGN PATENT DOCUMENTS

JP        62-002651 A     1/1987
JP        63-164271 A     7/1988

(Continued)

OTHER PUBLICATIONS

International Search Report issued in International Application No. PCT/JP2012/004166, with Date of mailing Sep. 25, 2012, with English Translation.

*Primary Examiner* — Mohammad Islam
*Assistant Examiner* — Chi-Hua Yang
(74) *Attorney, Agent, or Firm* — McDermott Will & Emery LLP

(57) ABSTRACT

A solid-state imaging apparatus having a plurality of pixels, comprising: a substrate; a wiring layer formed on the substrate and including an insulating film and a plurality of wires; a plurality of lower electrodes formed on the wiring layer in one-to-one correspondence with the plurality of pixels; a photoelectric conversion film formed covering the plurality of lower electrodes; a light-transmissive upper electrode formed on the photoelectric conversion film; and a shield electrode extending through a gap between each pair of adjacent lower electrodes among the plurality of lower electrodes, the shield electrode having a fixed potential and being electrically insulated from the plurality of lower electrodes.

18 Claims, 12 Drawing Sheets

(56) References Cited

U.S. PATENT DOCUMENTS

| | | | |
|---|---|---|---|
| 7,919,796 B2 * | 4/2011 | Kim | H01L 27/14634 257/233 |
| 8,325,254 B2 * | 12/2012 | Yanagita | H01L 27/14623 257/435 |
| 8,717,259 B2 * | 5/2014 | Park | H01L 27/3265 257/40 |
| 2004/0201072 A1 | 10/2004 | Rhodes | |
| 2007/0032030 A1 * | 2/2007 | Coolbaugh | H01L 23/5227 438/381 |
| 2008/0246107 A1 * | 10/2008 | Maehara | H01L 27/1462 257/432 |
| 2009/0152439 A1 | 6/2009 | Goto | |
| 2010/0110271 A1 * | 5/2010 | Yanagita | H01L 27/14623 348/340 |
| 2011/0068433 A1 * | 3/2011 | Kim | H01L 23/552 257/531 |
| 2012/0161299 A1 * | 6/2012 | Gambino | H01L 27/14632 257/659 |

FOREIGN PATENT DOCUMENTS

| | | |
|---|---|---|
| JP | 04-024966 A | 1/1992 |
| JP | 04-030577 A | 2/1992 |
| JP | 2000-156490 A | 6/2000 |
| JP | 2006-523034 A | 10/2006 |
| JP | 2008-112907 A | 5/2008 |
| JP | 2008-252004 A | 10/2008 |
| JP | 2008-263119 A | 10/2008 |
| JP | 2009-147147 A | 7/2009 |

* cited by examiner

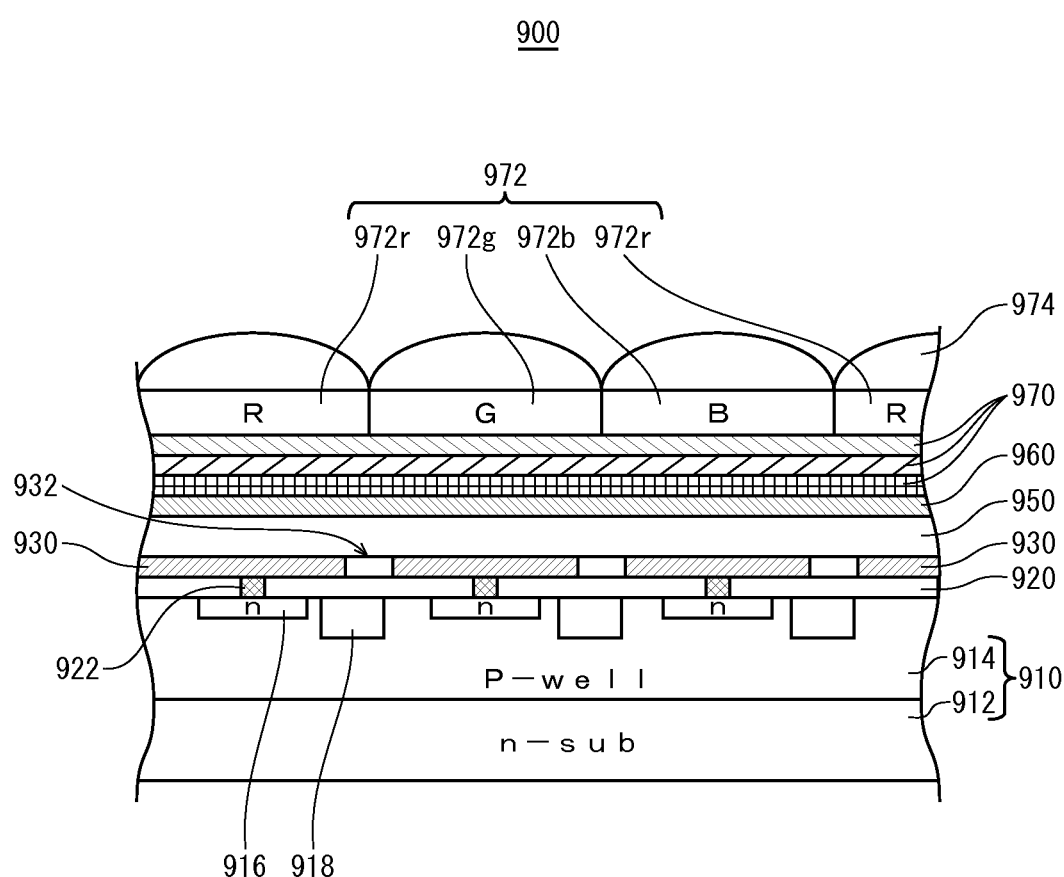

SOLID-STATE IMAGE PICKUP DEVICE

CROSS REFERENCE TO RELATED APPLICATION

This is a continuation application of PCT Application No. PCT/JP2012/004166 filed Jun. 27, 2012, designating the United States of America, the disclosure of which, including the specification, drawings and claims, is incorporated herein by reference in its entirety.

TECHNICAL FIELD

The present invention relates to a solid-state imaging apparatus, and in particular to the structure of a laminated solid-state imaging apparatus that uses a photoelectric conversion film to perform a photoelectric conversion on the incident light.

BACKGROUND ART

FIG. 11 illustrates, as one example of a conventional solid-state imaging apparatus, a solid-state imaging apparatus 900 in which a plurality of sets of color filters 972r, 972g and 972b are arranged. As illustrated in FIG. 12, the solid-state imaging apparatus 900 includes: a semiconductor substrate 910 that includes an n-type silicon substrate 912 and a p-type well region 914; an insulating film 920 formed on the semiconductor substrate 910; a plurality of lower electrodes 930 formed on the insulating film 920; a photoelectric conversion film 950 formed on the lower electrodes 930; and an upper electrode 960 formed on the photoelectric conversion film 950. The solid-state imaging apparatus 900 further includes: a protection film 970 formed on the upper electrode 960; a color filter 972 formed on the protection film 970; and a micro lens 974 formed on the color filter 972. In the well region 914, n-type charge storage units 916 and signal reading units 918 for reading signal charges from the charge storage units 916 are formed. In the insulating film 920, a plurality of plugs 922 made of a conductive material are embedded. The lower electrodes 930 are formed in separation from each other by gaps 932, and in correspondence with a plurality of pixels respectively. The potential of the lower electrodes 930 is not fixed, and they are in the floating state.

When a positive pulse is applied to the upper electrode 960, signal charges generated by the photoelectric conversion film 950 are transferred, passing through the lower electrodes 930 and the plugs 922, to the charge storage units 916 and are stored therein. The signal charges stored in the charge storage units 916 are read by the signal reading units 918 after a predetermined time period of storage. Subsequently, the signal charges are output to outside via an amplifier.

Meanwhile, regions of the photoelectric conversion film 950 located on the gaps 932 between the lower electrodes 930 are lower in electric field intensity than regions of the photoelectric conversion film 950 located on the lower electrodes 930. This causes the signal charges to move slower in the regions of the photoelectric conversion film 950 located on the gaps 932 between the lower electrodes 930, and to be read into a frame that comes later than the originally expected frame. In that case, an afterimage may be displayed. Patent Literature 2 discloses a structure for solving this problem where the gaps between adjacent lower electrodes 930 are each set to at most 3 μm in width (namely, distance between adjacent lower electrodes).

CITATION LIST

Patent Literature

Patent Literature 1: Japanese Patent Application Publication No. 2008-252004
Patent Literature 2: Japanese Patent Application Publication No. 2009-147147

SUMMARY OF INVENTION

Technical Problem

However, according to the above-mentioned conventional solid-state imaging apparatus, each pair of adjacent lower electrodes may be affected by an electrostatic coupling that is generated therebetween due to a difference in potential. Here, the electrostatic coupling refers to, for example, a phenomenon where placing a conductor near another conductor in which electric current is flowing allows for a floating capacitance to be generated between the conductors, and a voltage is induced. More specifically, when a large amount of signal charges is stored in one lower electrode in a pair of adjacent lower electrodes, opposite charges may be attracted to a portion of the other lower electrode closer to the one lower electrode, and pseudo signals may be generated in other portions thereof. The amount of pseudo signals generated in each lower electrode varies depending on the amount of signal charges stored in a lower electrode adjacent thereto. When different amounts of pseudo signals are generated in the lower electrodes and read to outside via the charge storing units, different noises are output for each pixel, which deteriorates the image quality of the images that are taken and output by the solid-state imaging apparatus.

In recent years in particular, with the miniaturization of the pixels, a less amount of signal charges is generated for each pixel by the photoelectric conversion film and passed through each of the lower electrodes. As a result, the ratio of the pseudo signals to the original signal charges has increased, and the degradation of the image quality due to the pseudo signals has become a serious problem.

For example, in the case where the unit pixel size is 1.75 μm×1.75 μm, and maximum amount of charges that can be stored per unit pixel is approximately 10,000 electrons, when the distance between lower electrodes is 0.2 μm and the film thickness of the lower electrodes is 0.1 μm, the influence received from an adjacent pixel in one direction among four directions will be an increase or decrease of approximately 250 electrons at the largest in the electrons stored in a pixel. When Bayer array is adopted for arranging color filters of different colors, the deterioration of the image quality in color (resolution) becomes more prominent. For example, a green color filter is surrounded by red and blue color filters in four directions. When red strong light is incident in this region, the green color filter has a signal output of approximately 500 electrons at the largest due to an electrostatic coupling caused by the potential of lower electrodes of two red color filters adjacent to the green color filter in two directions. This causes the red color filters to have reduction of approximately 500 electrons at the largest in signal output. When the number of storable electrons per pixel is assumed to be approximately 10,000, approximately 5% of signal output is varied in this example case, which means an image that is slightly different in color from the imaging object is output.

It is therefore an object of the present invention to provide a solid-state imaging apparatus that suppresses lower electrodes from generating different amounts of pseudo signals, while allowing for a gap between each pair of adjacent lower electrodes to be narrow.

Solution to Problem

According to one aspect of the present invention, there is provided a solid-state imaging apparatus having a plurality of pixels, comprising: a substrate; a wiring layer formed on the substrate and including an insulating film and a plurality of wires; a plurality of lower electrodes formed on the wiring layer in one-to-one correspondence with the plurality of pixels; a photoelectric conversion film formed covering the plurality of lower electrodes; a light-transmissive upper electrode formed on the photoelectric conversion film; and a shield electrode extending through a gap between each pair of adjacent lower electrodes among the plurality of lower electrodes, the shield electrode having a fixed potential and being electrically insulated from the plurality of lower electrodes.

According to another aspect of the present invention, there is provided a solid-state imaging apparatus having a plurality of pixels, comprising: a substrate; a wiring layer formed on the substrate and including an insulating film and a plurality of wires; a plurality of lower electrodes formed on the wiring layer in one-to-one correspondence with the plurality of pixels; a photoelectric conversion film formed covering the plurality of lower electrodes; a light-transmissive upper electrode formed on the photoelectric conversion film; and a plurality of shield wires formed such that at least one shield wire is present between each pair of adjacent wires among the plurality of wires, the plurality of shield wires having a fixed potential and being electrically insulated from the plurality of wires.

Advantageous Effects of Invention

In the solid-state imaging apparatus according to one aspect of the present invention, a shield electrode having a fixed potential is formed to extend through a gap between each pair of adjacent lower electrodes. With this structure, the lower electrodes are electrostatically coupled with the shield electrode having a fixed potential, and all the lower electrodes are equally affected by the electrostatic coupling. This makes it possible to prevent the lower electrodes from generating different amounts of pseudo signals. That is to say, since all the lower electrodes generate the same amount of pseudo signals, correcting the signal output values in advance makes it possible to suppress the deterioration of the image quality of images taken and output by the solid-state imaging apparatus.

Thus the solid-state imaging apparatus according to one aspect of the present invention can suppress adjacent lower electrodes from having an electrostatic coupling therebetween and the lower electrodes from generating different amounts of pseudo signals, while allowing for a gap between each pair of adjacent lower electrodes to be narrow.

BRIEF DESCRIPTION OF DRAWINGS

FIG. 12 is a diagram for explaining the structure of a conventional solid-state imaging apparatus.

DESCRIPTION OF EMBODIMENTS

[Embodiment 1]

1. Structure of Solid-State Imaging Apparatus 100

Figure 1:
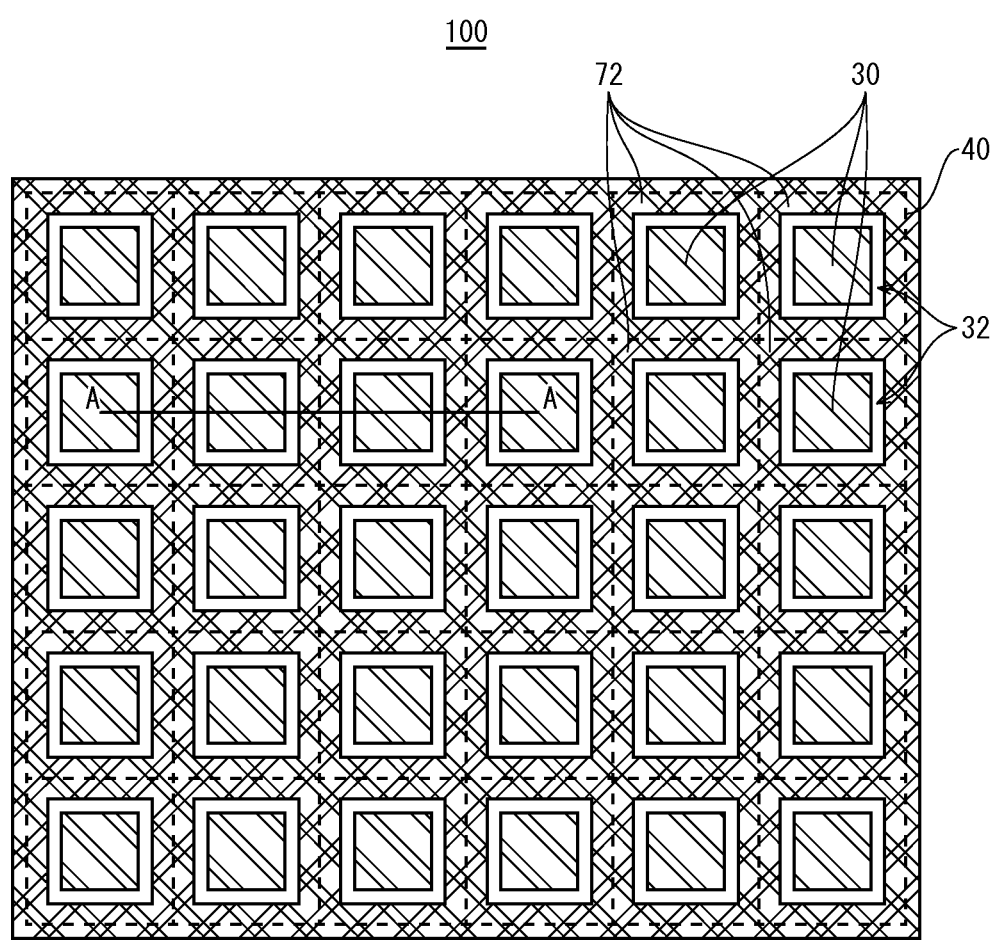
FIG. 1 is a layout diagram for explaining the structural elements of a solid-state imaging apparatus in Embodiment 1 of the present invention.

FIG. 1 is a layout diagram for explaining the shapes of lower electrodes 30, a shield electrode 40, and a color filter 72 that are structural elements of a solid-state imaging apparatus 100 of Embodiment 1, and the positional relationship thereamong.

The solid-state imaging apparatus 100 having a plurality of pixels includes: the color filter 72 partitioned into sections corresponding one-to-one to the plurality of pixels; the lower electrodes 30 corresponding one-to-one to the plurality of pixels and each having been formed in the square shape, with a gap 32 being provided between each pair of adjacent lower electrodes 30; and the shield electrode 40 formed in a square lattice pattern to extend through the gap 32 between each pair of adjacent lower electrodes 30 and surround each of the lower electrodes 30. The potential of the shield electrode 40 is fixed. This is explained in detail below. The color filter 72 is composed of color filters 72r, color filters 72g and color filters 72b that transmit light of red (wavelength band of approximately 600 nm to 700 nm), green (wavelength band of approximately 500 nm to 600 nm) and blue (wavelength band of approximately 400 nm to 500 nm), respectively, and are arranged in Bayer array.

Figure 2:
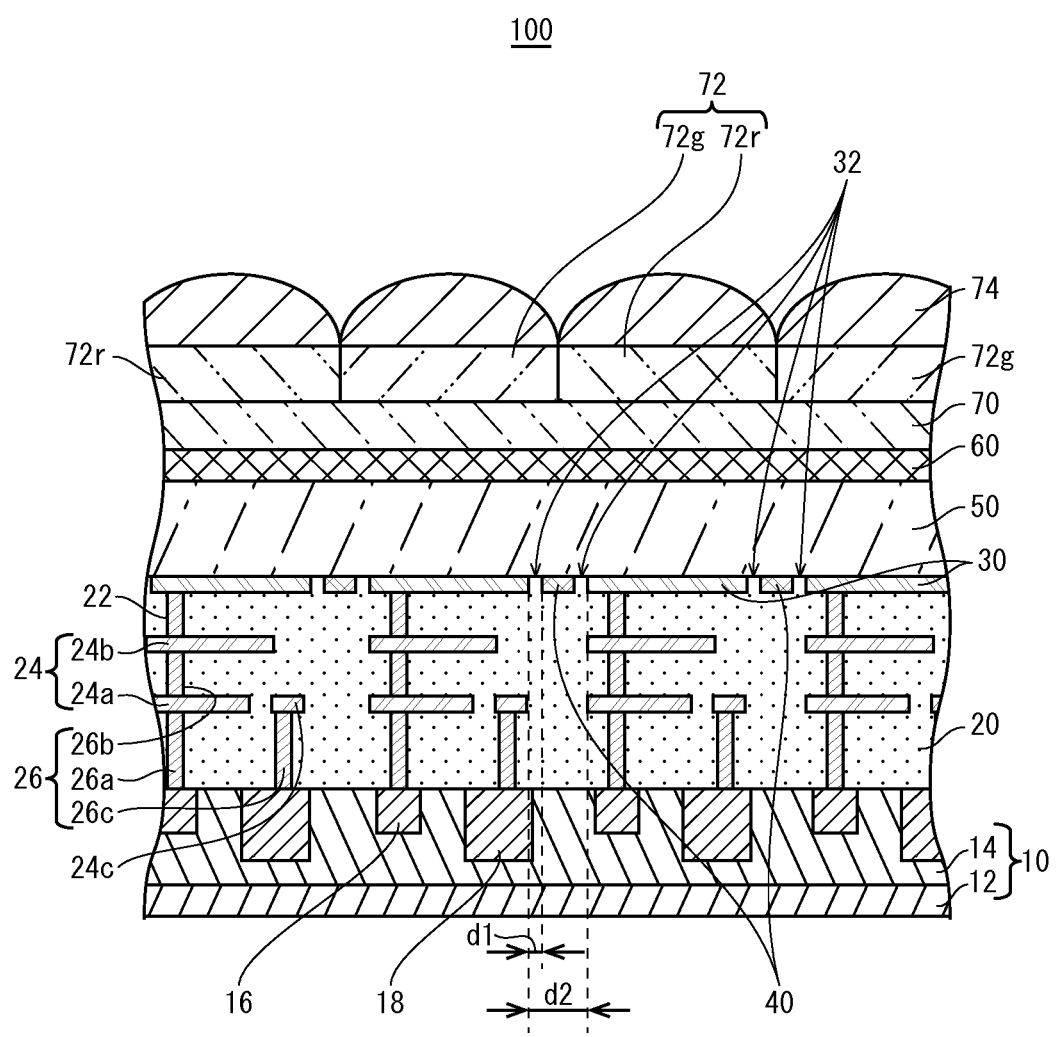
FIG. 2 is a cross-sectional view of the solid-state imaging apparatus taken along line A-A of FIG. 1.

FIG. 2 is a cross-sectional view of the solid-state imaging apparatus 100 taken along line A-A of FIG. 1.

As illustrated in FIG. 2, the solid-state imaging apparatus 100 includes: a semiconductor substrate 10 that includes an n-type silicon substrate 12 and a p-type well region 14; charge storing units 16 formed in the p-type well region 14; signal reading units 18 formed in the p-type well region 14; an insulating film 20 laminated on the semiconductor substrate 10; lower electrodes 30 formed in the upper portion of the insulating film 20; a photoelectric conversion film 50 formed on the lower electrodes 30; an upper electrode 60 formed on the photoelectric conversion film 50; a protection film 70 formed on the upper electrode 60; a color filter 72 formed on the protection film 70; and a micro lens 74 formed on the color filter 72.

Wires 22 and wires 24 are embedded in the insulating film 20, each of the wires 24 is connected to a lower electrode 30 via a wire 22, and the wires 24 are connected to each other via contact plugs 26. Each of the wires 24 is composed of wires 24a, 24b and 24c. Each of the contact plugs 26 is composed of contact plugs 26a, 26b and 26c. With this structure, signal charges collected by the lower electrodes are transferred to the charge storing units 16. There is provided a gap 32 between each pair of adjacent lower electrodes 30, and the shield electrode 40 is formed to extend through the gap 32. A wire is connected to the upper electrode 60, and a positive bias voltage is applied to the upper electrode 60 via the wire. With the application of the bias voltage, positive holes generated in the photoelectric conversion film 50 move to the lower electrodes 30, and electrons move to the upper electrode 60.

The photoelectric conversion film 50 is extended to cover the plurality of lower electrodes 30. An application of a voltage to the photoelectric conversion film 50 may improve the photoelectric conversion efficiency. The voltage to be applied to the photoelectric conversion film 50 to obtain a desired photoelectric conversion efficiency varies depending on the film thickness of the photoelectric conversion film 50. More specifically, the higher the electric field applied to the photoelectric conversion film 50 is, the more the photoelectric conversion efficiency improves. Furthermore, in the case where the same voltage is applied, the smaller the film thickness of the photoelectric conversion film 50 is, the higher the electric field applied to the photoelectric conversion film 50 is. Accordingly, when the film thickness of the photoelectric conversion film 50 is small, a desired photoelectric conversion efficiency may be obtained even if a low voltage is applied. In the solid-state imaging apparatus 100, the lower limit of the electric field to be applied to the photoelectric conversion film 50 is preferably at least $10V \cdot m^{-1}$, and more preferably at least $1 \times 10^3 V \cdot m^{-1}$. With application of an excessively high electric field, electric current would flow even in locations corresponding to a small amount of incident light. This taken into account, although there is no upper limit to the applied electric field in particular, the upper limit of the electric field to be applied to the photoelectric conversion film 50 is preferably at most $1 \times 10^{12} V \cdot m^{-1}$, and more preferably at most $1 \times 10^9 V \cdot m^{-1}$.

3. Driving Solid-State Imaging Apparatus 100

The light incident to the micro lens 74 is collected, and the collected incident light passes through the color filter 72 and enters the photoelectric conversion film 50 that has the photoelectric conversion function. The photoelectric conversion film 50 generates signal charges from the incident light. The generated signal charges pass through the wires 22 and are stored in the charge storing units 16. In this state, when a read pulse is applied to reading gates (not illustrated), the signal charges having been stored are read by the signal reading units 18. Subsequently, the signals are read in sequence as is the case with a conventional MOS-type solid-state imaging apparatus.

The color filters 72r transmit light of the red wavelength band, and thus signals output from regions corresponding to the color filters 72r correspond to red light. This also applies to the green color filters 72g and the blue color filters 72b. In this way, the solid-state imaging apparatus 100 can generate color image data.

4. Measurements, Materials, and Manufacturing Method of Solid-State Imaging Apparatus 100

The unit pixel size of the solid-state imaging apparatus 100 is, for example, 1.75 μm×1.75 μm.

As described above, the semiconductor substrate 10 may be made of, for example, silicon, and the insulating film 20 may be made of, for example, silicon oxide.

The wires 24 may be made of, for example, a material selected from the group consisting of Cu, Al alloy, W, Mo (molybdenum), Ti (titanium), and TiN (titanium nitride), and function as signal lines, power lines, and connection lines.

The contact plugs 26 may be made of, for example, a material selected from the group consisting of W (tungsten), Cu, Al, Ag, Au, and Cr (chromium). To form the contact plugs 26, first openings may be made in the insulating film 20 by the lithography technique or the anisotropic dry etching such as RIE (Reactive Ion Etching), and then a metal may be embedded in the openings by, for example, the blanket CVD method.

The lower electrodes 30 and the shield electrode 40 may be made of a conductive metal material that is opaque and shields the incident light, such as Al—Si—Cu alloy, Al, Ti, TiN, Cu, Cr, In, or Ag. To form the shield electrode 40, for example, first a film may be formed by the DC sputtering method and then openings may be formed by the lithography technique or the dry etching technique.

A width d1 of a gap between a lower electrode 30 and the shield electrode 40 is, for example, 0.1 μm to 0.3 μm. The width d1 in this range can improve the sensitivity of the lower electrodes 30 as much as possible in the manufacturing process, and can suppress the influence of the electrostatic coupling. A width d2 of the gap 32 between each pair of adjacent lower electrodes 30 is, for example, 0.3 μm to 0.8 μm. The width d2 is set to a distance that is appropriate enough for suppressing display of afterimage, which would be caused because signal charges generated in the regions of the photoelectric conversion film 50 located on the gap 32 are read more slowly than signal charges generated in the regions located on the lower electrodes 30.

The photoelectric conversion film 50 may have at least 50% of optical absorption rate at wavelength 400 nm to 700 nm, and may be composed of, for example, an organic photoconductive film. The organic photocoelectric conversion film contains a photoelectric conversion material that generates charges by absorbing light of a predetermined wavelength band, and has excellent spectral characteristics and sensitivity. Furthermore, the photoelectric conversion film 50 is preferably made of a material having high quantum efficiency so that high sensitivity can be maintained, the quantum efficiency being represented by the number of output electrons per incident photon.

The upper electrode 60 may be made of TCO (Transparent Conducting Oxide) having high transmittance of visible light and a low resistance value, such as ITO (Indium Tin Oxide), for example.

The protection film 70 may be made of a material, such as silicon nitride, that has both transparency and a protection function to protect the photoelectric conversion film 50 and the upper electrode 60. It should be noted here that the protection function refers to the material's denseness or non-reactiveness for preventing water or oxygen from penetrating into or reacting with the material. To form the protection film 70 made of nitride, a film may be formed by the PVD (Physical Vapor Deposition) method. Use of this method makes it possible to form a dense silicon nitride film without changing the photoelectric conversion film 50 and the upper electrode 60. Note that, if the protection film 70 has at least 80% of light transmittance for wavelength band of 400 nm to 700 nm, the photoelectric conversion film 50 can cause an enough amount of light to enter. The thickness of the protection film 70 is preferably 0.1 μm to 10 μm, more preferably 0.5 μm to 5 μm, and more further preferably 1 μm to 3 μm.

The color filter 72 may be made of, for example, an organic material such as acrylic resin containing pigment. The film thickness of the color filter 72 is set based on the spectral characteristics and the transmittance of the material of the color filter 72 on the incident light, and may be set to, for example, 0.2 µm to 0.5 µm.

The micro lens 74 may be made of, for example, acrylic resin.

5. Setting Potential of Shield Electrode

The potential of the shield electrode 40 needs to be set to an intermediate potential (a voltage between 0 V and 10 and several V), which is a potential between the potentials of the upper electrode 60 and the lower electrodes 30. When the potential of the shield electrode 40 is set to an average potential between the potentials of the upper electrode 60 and the lower electrodes 30, compared to the case where the potential of the shield electrode 40 is set to any other value, an electric field stress to the photoelectric conversion film 50 is reduced, insulation of the regions of the insulating film 20 below the gaps 32 is maintained, and the loss in collecting charges generated in the photoelectric conversion film 50 into the lower electrodes 30 is suppressed. When the potential of the shield electrode 40 is set to a value that is higher than the average potential between the potentials of the upper electrode 60 and the lower electrodes 30 and is equal to or lower than the potential of the upper electrode 60, the loss in collecting charges generated in the photoelectric conversion film 50 into the lower electrodes 30 is further reduced.

Furthermore, when the shield electrode 40 is electrically connected to a plurality of portions of a power wire that supplies power to the pixel reading circuits formed in the pixels, the shield electrode 40 can be used as a power wire as well. This allows for the shield electrode 40 to function as a shunt wire as well. As a result of this, voltage drop in the power wire is suppressed, and power is supplied to the pixel reading circuits more stably.

6. Effects

There is provided a gap 32 between each pair of adjacent lower electrodes 30, and the shield electrode 40 having a fixed potential is formed to extend through the gap 32. This structure allows for an electrostatic coupling to be generated between each pair of a lower electrode 30 and a part of the shield electrode 40 adjacent thereto. It should be noted here that, since the potential of the shield electrode 40 is fixed, all the lower electrodes 30 are equally affected by the electrostatic coupling. This makes it possible to prevent the lower electrodes 30 from generating different amounts of pseudo signals. That is to say, since all the lower electrodes 30 generate the same amount of pseudo signals, correcting the signal output values in advance makes it possible to suppress the deterioration of the image quality of images taken and output by the solid-state imaging apparatus 100.

The shield electrode 40 may be made of the same material as the lower electrodes 30, and may be aligned with the lower electrodes 30 so that the upper surfaces of both are at the same height. Accordingly, the lower electrodes 30 and the shield electrode 40 may be formed at the same time. This eliminates the need to separately add a manufacturing step for forming the shield electrode 40. Accordingly, since a misalignment of masks does not occur during the manufacturing process, the lower electrodes 30 and the shield electrode 40 can be easily formed at appropriate positions.

Furthermore, since the shield electrode 40 is made of a metal, the amount of incident light that enters the semiconductor substrate 10 is reduced, and it is possible to restrict an inappropriate operation of the reading circuit that would be caused upon entering of the light into the semiconductor substrate 10.

[Embodiment 2]

1. Solid-State Imaging Apparatus 200

Figure 3:
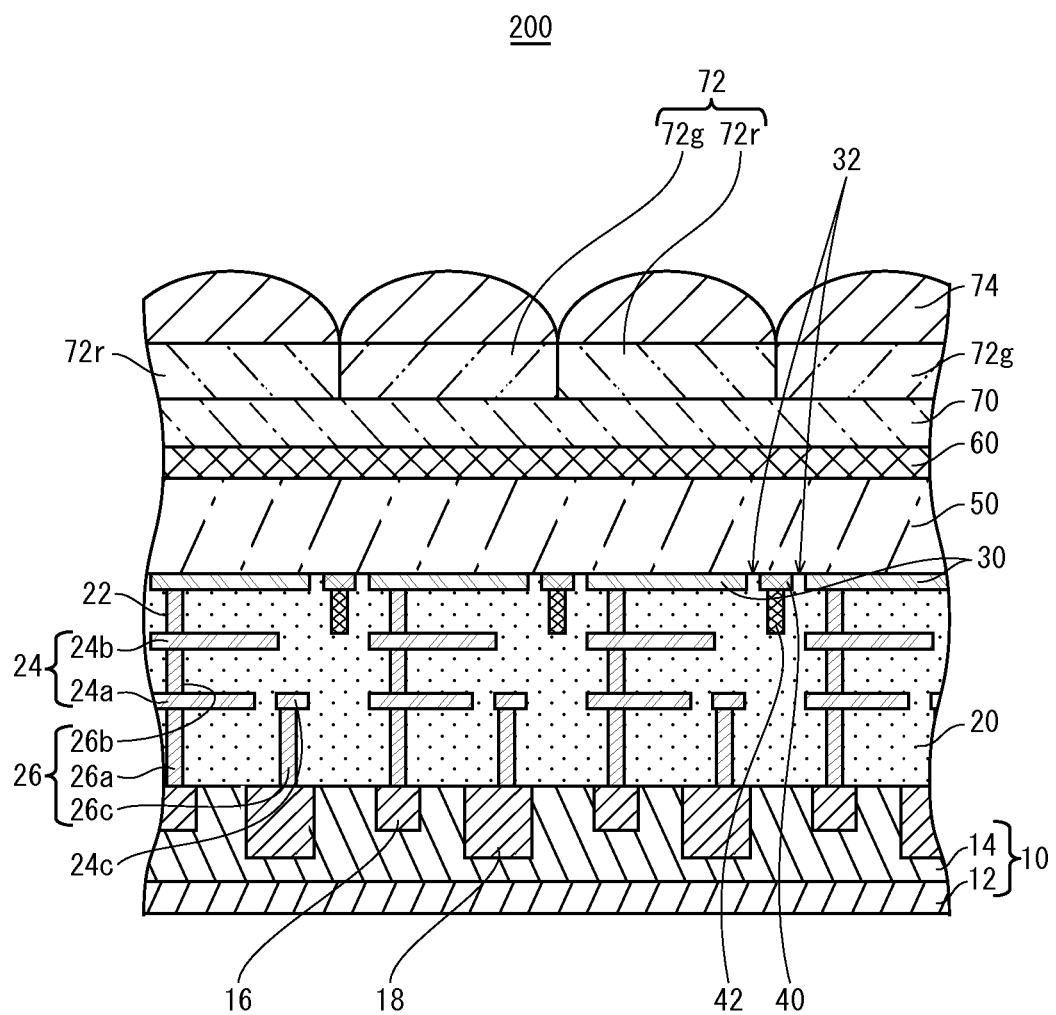
FIG. 3 is a cross-sectional view of a solid-state imaging apparatus in Embodiment 2 of the present invention taken along line A-A.

FIG. 3 is a cross-sectional view illustrating the structure of a solid-state imaging apparatus 200 in Embodiment 2. The solid-state imaging apparatus 200 have the same structure as the solid-state imaging apparatus 100 except for the following, and explanation of the same elements is omitted.

Shield wires 42 are formed between each pair of adjacent wires 22. The shield wires 42 and the wires 22 are electrically insulated from each other. The shield wires 42 are electrically connected to the shield electrode 40, and thus the potential of the shield wires 42 are fixed to the potential of the shield electrode 40. The shield wires 42 and the wires 22 are made of the same material, and are aligned with each other so that the upper surfaces of both are at the same height.

2. Effects

Meanwhile, a noise, which is similar to the noise that would occur between adjacent lower electrodes 30, may occur between adjacent wires 22 as well. In conventional solid-state imaging apparatuses, due to miniaturization of the pixels, the gap between adjacent wires has become narrower, and adjacent wires may be affected by an electrostatic coupling that is generated therebetween due to a difference between the potentials thereof. When a large amount of signal charges is stored in one wire in a pair of adjacent wires, opposite charges may be attracted to a portion of the other wire closer to the one wire, and pseudo signals may be generated in other portions thereof. The amount of pseudo signals generated in each wire varies depending on the amount of signal charges stored in a wire adjacent thereto. When different amounts of pseudo signals are generated in the lower electrodes and read to outside via the charge storing units, different noises are output for each pixel, which deteriorates the image quality of the images that are taken and output by the solid-state imaging apparatus.

In the solid-state imaging apparatus 200, the shield wires 42 having a fixed potential are formed between each pair of adjacent wires 22. With this structure, the wires 22 are electrostatically coupled with the shield wires 42 having a fixed potential, and all the wires 22 are equally affected by the electrostatic coupling. This makes it possible to prevent the wires 22 from generating different amounts of pseudo signals. That is to say, since the wires 22 generate the same amount of pseudo signals, correcting the signal output values in advance makes it possible to suppress the deterioration of the image quality of images taken and output by the solid-state imaging apparatus 200. Thus the solid-state imaging apparatus 200 can suppress adjacent wires 22 from having an electrostatic coupling therebetween and the wires from generating different amounts of pseudo signals, while allowing for a gap between each pair of adjacent wires 22 to be narrow due to miniaturization.

That is to say, in the solid-state imaging apparatus 200, since the potential of the shield electrode 40 and the shield wires 42 is fixed, all the lower electrodes 30 and the wires 22 are equally affected by the electrostatic coupling. This makes it possible to further prevent the lower electrodes 30 from generating different amounts of pseudo signals.

Note that the shield wires 42 are made of the same material as the wires 22, and are formed to have the same height as the wires 22. Accordingly, the wires 22 and the shield wires 42 can be formed at the same time. This eliminates the need to separately add a manufacturing step for forming the shield wires 42. Accordingly, since a misalignment of masks does not occur during the manufacturing process, the wires 22 and the shield wires 42 can be easily formed at appropriate positions.

Furthermore, the shield wires 42 are electrically connected to the shield electrode 40. This makes it possible to form the shield wires 42 in an island shape, for example. With this structure, there is no need to pull around the shield wires 42 all over the solid-state imaging apparatus 200 to enable the electrical connection of the shield wires 42. This increases the freedom in design.

Note that, if the influence of the electrostatic coupling between the lower electrodes 30 is at a negligible level, the shield electrode 40 may not be formed, and only the shield wires 42 may be formed.

[Embodiment 3]

1. Solid-State Imaging Apparatus 300

Figure 4:
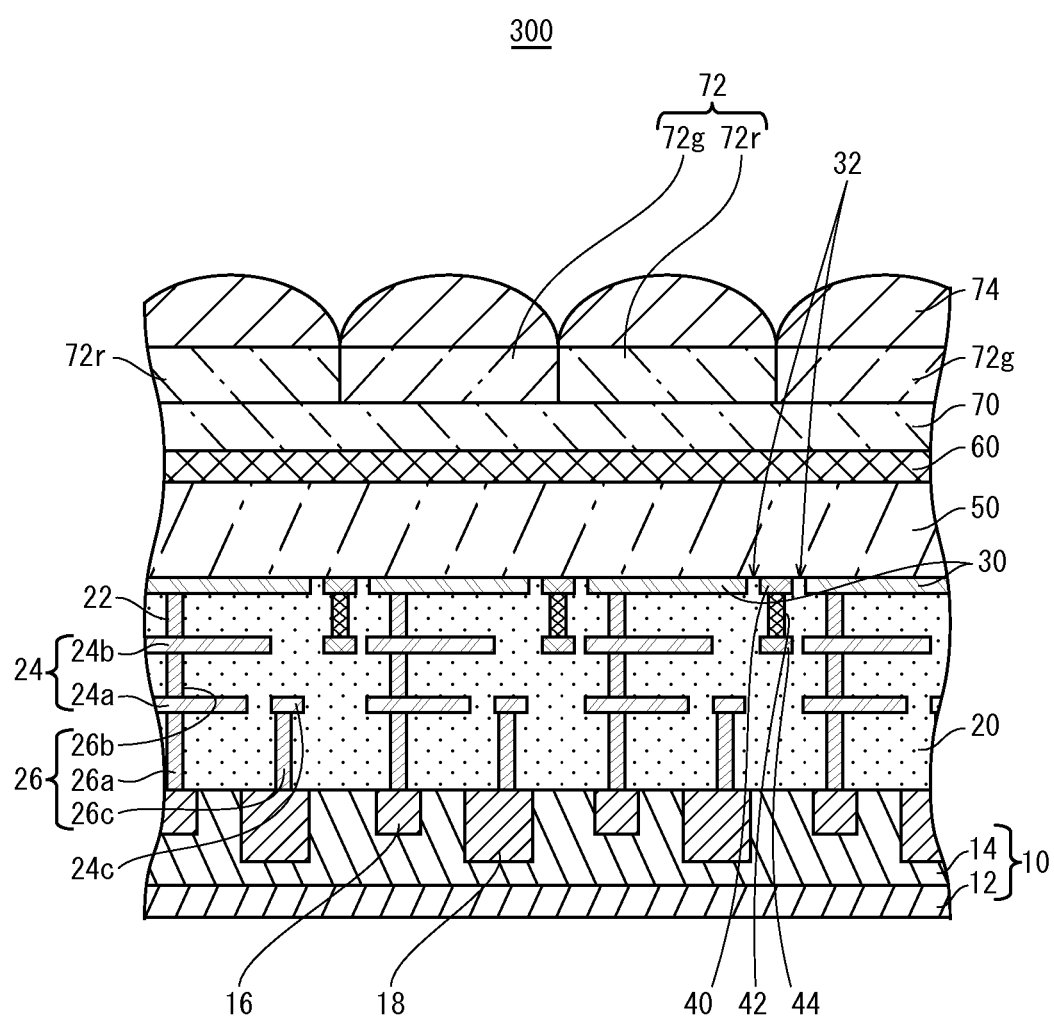
FIG. 4 is a cross-sectional view of a solid-state imaging apparatus in Embodiment 3 of the present invention taken along line A-A.

FIG. 4 is a cross-sectional view illustrating the structure of a solid-state imaging apparatus 300 in Embodiment 3. The solid-state imaging apparatus 300 have the same structure as the solid-state imaging apparatus 200 except for the following, and explanation of the same elements is omitted.

Shield wires 44 are formed between each pair of adjacent wires 24b. The shield wires 42 and 44 are electrically connected to the shield electrode 40, and thus the potential of the shield wires 44 are fixed to the potential of the shield electrode 40. The shield wires 44 and the wires 24b are made of the same material, and are aligned with each other so that the upper surfaces of both are at the same height.

2. Effects

In the solid-state imaging apparatus 300, shield wires 44 are further formed to be respectively connected to the shield wires 42 and further to the shield electrode 40. With this structure, an electrostatic coupling may be present between a lower electrode 30 and the shield electrode 40 to which a shield wire 42 is connected, and since the potential of the shield electrode 40 and the shield wires 42 is fixed, all the lower electrodes 30 are equally affected by the electrostatic coupling. This makes it possible to further prevent the lower electrodes 30 from generating different amounts of pseudo signals.

The shield wires 44 and the wires 24b are made of the same material, and are aligned with each other so that the upper surfaces of both are at the same height. Accordingly, the wires 24b and the shield wires 44 can be formed at the same time. This eliminates the need to separately add a manufacturing step for forming the shield wires 44. Accordingly, since a misalignment of masks does not occur during the manufacturing process, the wires 24b and the shield wires 44 can be easily formed at appropriate positions.

[Embodiment 4]

1. Solid-State Imaging Apparatus 400

Figure 5:
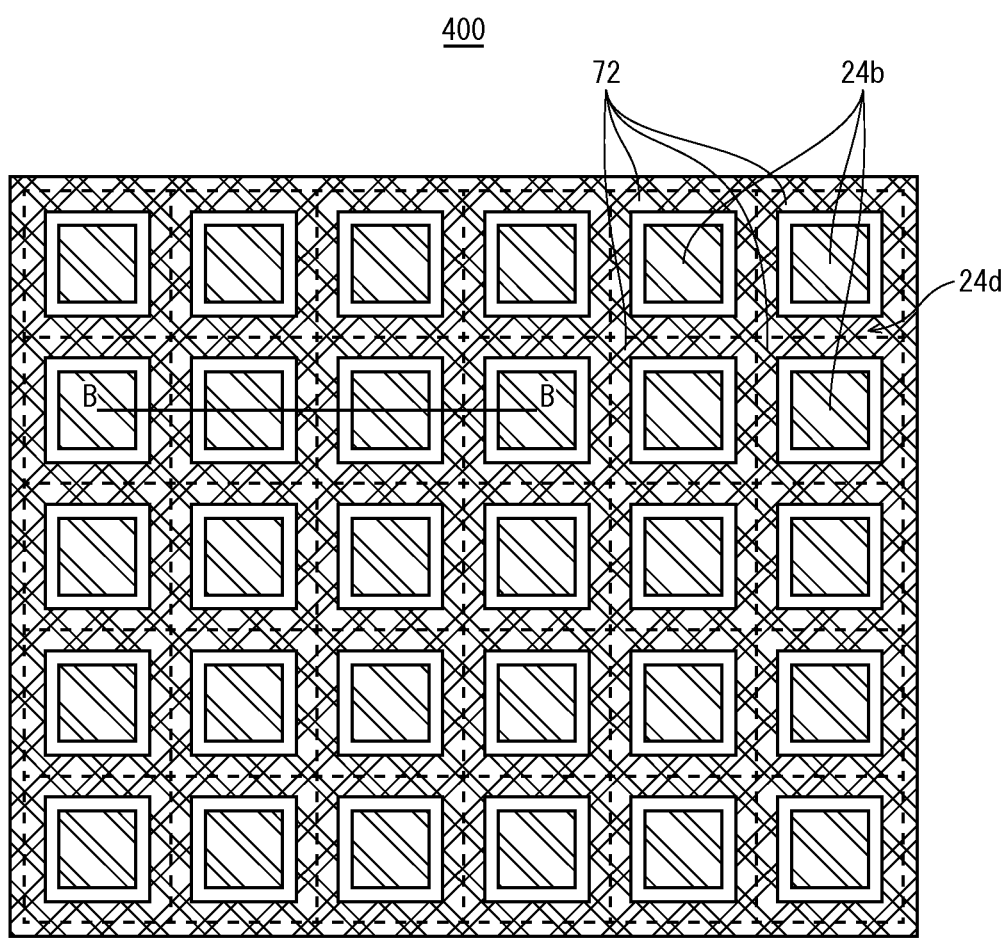
FIG. 5 is a layout diagram for explaining the structural elements of a solid-state imaging apparatus in Embodiment 4 of the present invention.

FIG. 5 is a layout diagram for explaining the shapes of wires 24b, shield wires 24d, and color filter 72 that are included in a solid-state imaging apparatus 400 of Embodiment 4, and the positional relationship thereamong.

Figure 6:
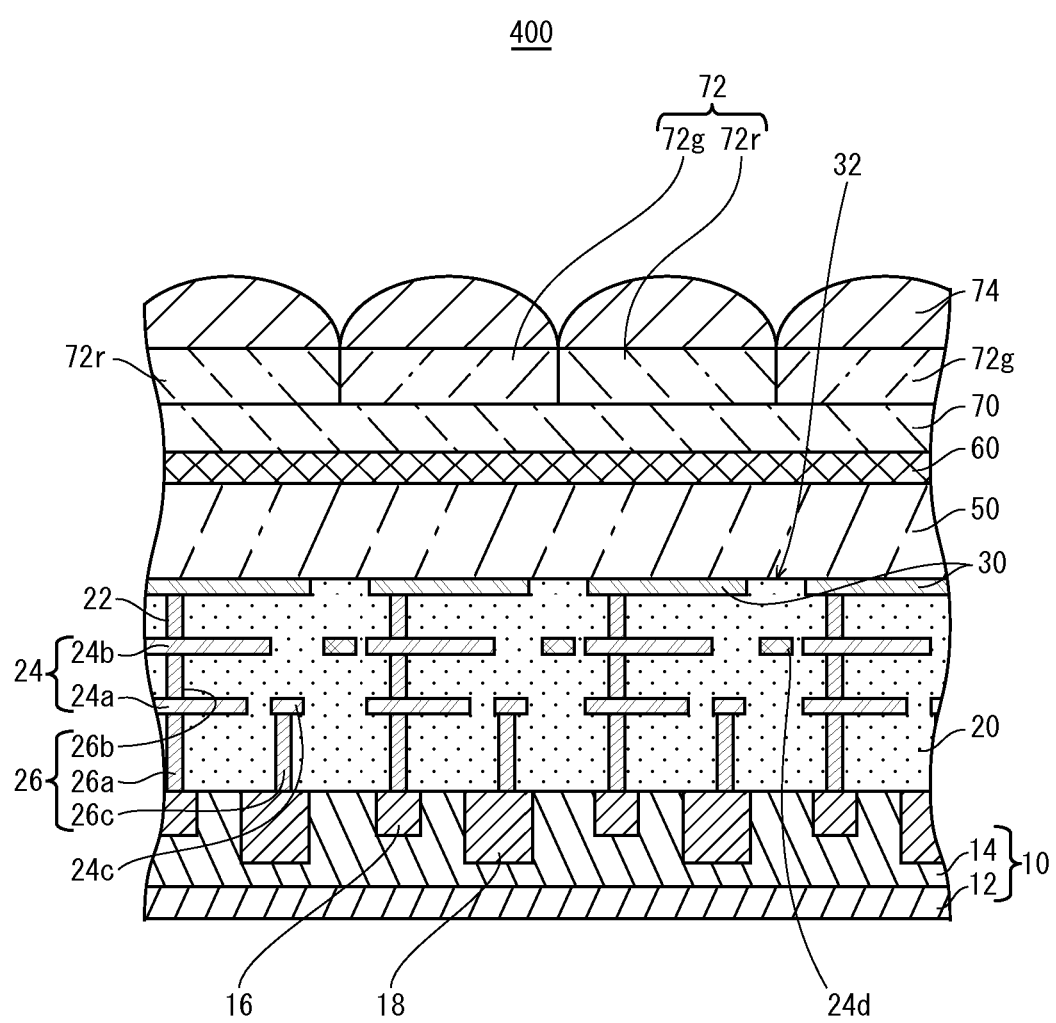
FIG. 6 is a cross-sectional view of the solid-state imaging apparatus taken along line B-B of FIG. 5.

FIG. 6 is a cross-sectional view of the solid-state imaging apparatus 400 taken along line B-B of FIG. 5. FIG. 6 is a cross-sectional view illustrating the structure of the solid-state imaging apparatus 400 in Embodiment 4. The solid-state imaging apparatus 400 have the same structure as the solid-state imaging apparatus 100 except for the following, and explanation of the same elements is omitted.

The unit pixel size of the solid-state imaging apparatus 400 has been reduced from the above-described unit pixel size of the solid-state imaging apparatus 100, 1.75 µm×1.75 µm, to a size where it is impossible to form the shield electrode 40 to extend through a gap provided between each pair of adjacent lower electrodes 30. Thus in the solid-state imaging apparatus 400, to obtain the same desired effect as in the solid-state imaging apparatus 100, shields wires 24d have been formed around each of the wires 24b. The shield wires 24d and the wires 24b are made of the same material, and are aligned with each other so that the upper surfaces of both are at the same height. The shield wires 24d can easily be formed to have a fixed potential or a floating potential.

2. Effects

The shield wires 24d shield the charge storing units 16 embedded in the semiconductor substrate 10, and the potential of the wires 24d is fixed. As a result, all the charge storing units 16 are equally affected by it. This makes it possible to prevent the lower electrodes 16 from generating different amounts of pseudo signals.

The shield wires 24d and the wires 24b are made of the same material, and are aligned with each other so that the upper surfaces of both are at the same height. Accordingly, the wires 24b and the shield wires 24d can be formed at the same time. This eliminates the need to separately add a manufacturing step for forming the shield wires 24d. Accordingly, since a misalignment of masks does not occur during the manufacturing process, the wires 24b and the shield wires 24d can be easily formed at appropriate positions.

[Embodiment 5]

1. Solid-State Imaging Apparatus 500

Figure 7:
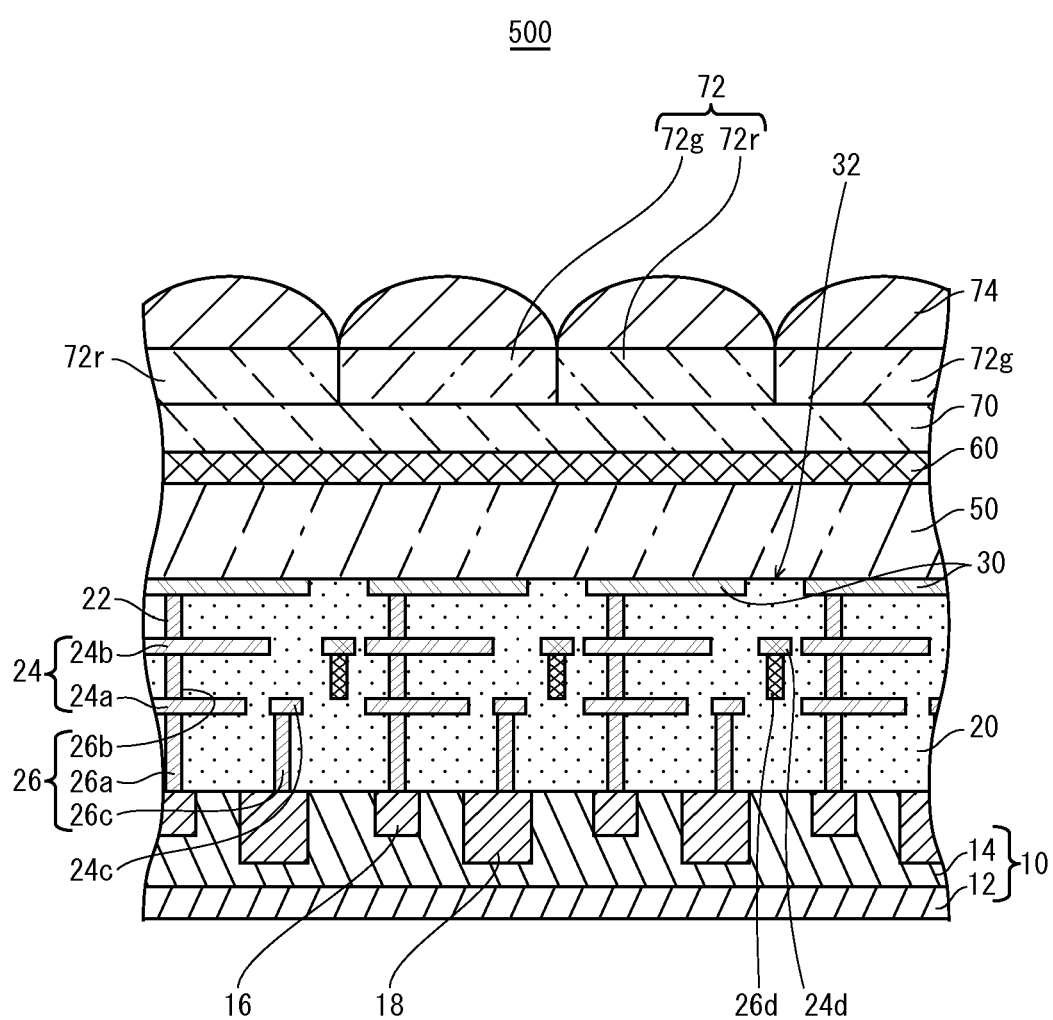
FIG. 7 is a cross-sectional view of a solid-state imaging apparatus in Embodiment 5 of the present invention taken along line B-B.

FIG. 7 is a diagram illustrating the structure of a solid-state imaging apparatus 500 in Embodiment 5. The solid-state imaging apparatus 500 have the same structure as the solid-state imaging apparatus 400 except for the following, and explanation of the same elements is omitted.

Shield wires 24d have been formed around each of the wires 24b, and shield wires 26d have been formed under respective shield wires 24d. The shield wires 26d and the wires 26b are made of the same material, and are aligned with each other so that the upper surfaces of both are at the same height. The shield wires 26d can easily be formed to have a fixed potential or a floating potential.

2. Effects

The shield wires 26d formed under the shield wires 24d shield the charge storing units 16 embedded in the semiconductor substrate 10, and the potential of the shield wires 24d is fixed. As a result, all the charge storing units 16 are equally affected by it. This makes it possible to prevent the lower electrodes 16 from generating different amounts of pseudo signals.

The shield wires 26d and the contact plugs 26b are made of the same material, and are aligned with each other so that the upper surfaces of both are at the same height. Accordingly, the contact plugs 26b and the shield wires 26d can be formed at the same time. This eliminates the need to separately add a manufacturing step for forming the shield wires 26d. Accordingly, since a misalignment of masks does not occur during the manufacturing process, the contact plugs 26b and the shield wires 26d can be easily formed at appropriate positions.

[Embodiment 6]

1. Solid-State Imaging Apparatus 600

Figure 8:
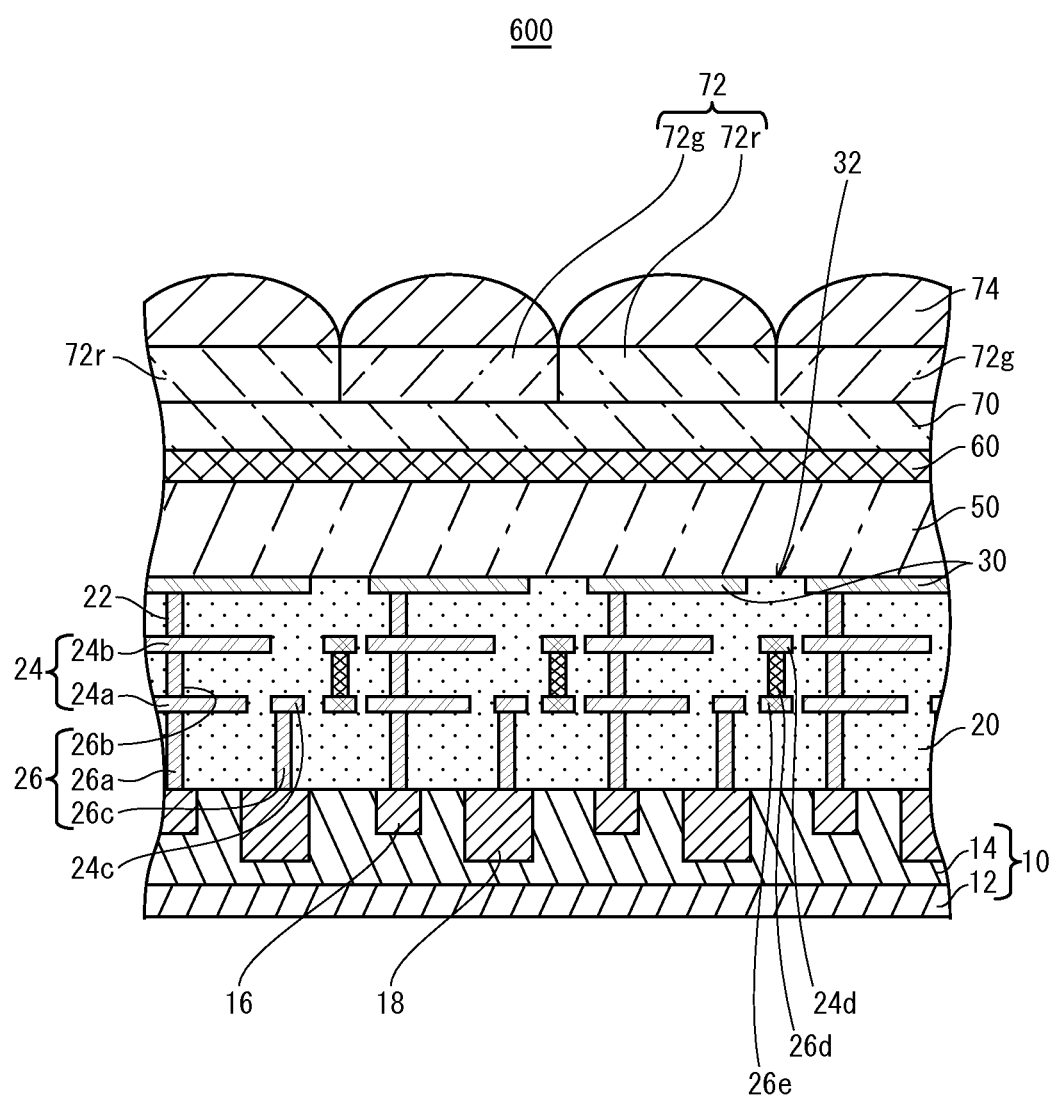
FIG. 8 is a cross-sectional view of a solid-state imaging apparatus in Embodiment 6 of the present invention taken along line B-B.

FIG. 8 is a diagram illustrating the structure of a solid-state imaging apparatus 600 in Embodiment 6. The solid-state imaging apparatus 600 have the same structure as the solid-state imaging apparatus 500 except for the following, and explanation of the same elements is omitted.

Shield wires 24d have been formed around each of the wires 24b, shield wires 26d have been formed under respective shield wires 24d, and shield wires 26e have been formed under respective shield wires 26d. The shield wires 26e and the wires 24a and 24c are made of the same material, and are aligned with each other so that their upper surfaces are at the same height. The shield wires 26e can easily be formed to have a fixed potential or a floating potential.

2. Effects

The shield wires 26e, which are each formed between a pair of a wire 24a and a wire 24c that are adjacent to each other, shield the charge storing units 16 embedded in the semiconductor substrate 10, and the potential of the shield wires 24d, 26d, and 26e is fixed. As a result, all the charge storing units 16 are equally affected by it. This makes it possible to prevent the lower electrodes 16 from generating different amounts of pseudo signals.

The shield wires 26e and the wires 24a and 24c are made of the same material, and are aligned with each other so that their upper surfaces are at the same height. Accordingly, the shield wires 26e and the wires 24a and 24c can be formed at the same time. This eliminates the need to separately add a manufacturing step for forming the shield wires 26e. Accordingly, since a misalignment of masks does not occur during the manufacturing process, the shield wires 26e and wires 24a and 24c can be easily formed at appropriate positions.

[Modifications]

1. Color Filter

In the above embodiments, Bayer array is adopted for arranging red, green and blue color filters. However, not limited to this, any other arrangement method for arranging the color filters adopted in any known solid-state imaging apparatus (for example, vertical stripes, horizontal stripes or the like) may be adopted.

2. Shape of Shield Electrode

Figure 9:
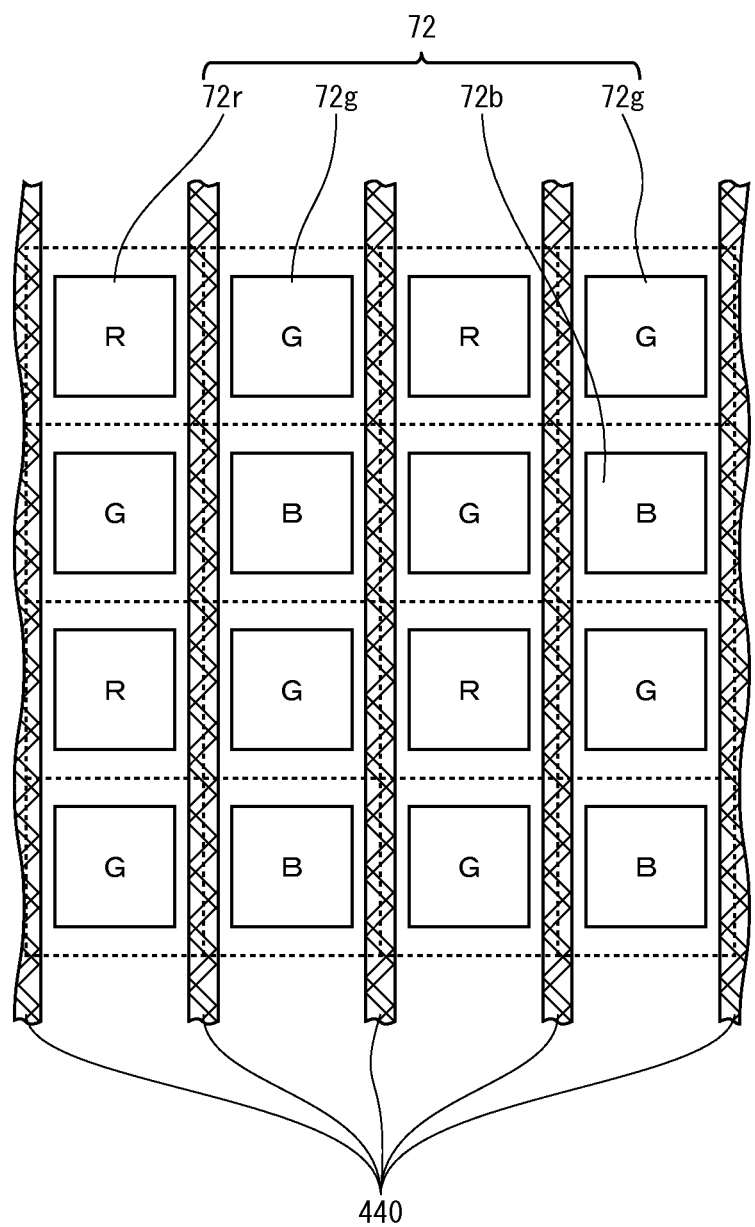
FIG. 9 is a diagram for explaining a solid-state imaging apparatus of a modification.

In the above embodiments, the shield electrode is formed in a square lattice pattern in plan view. However, not limited to this, the shield electrode may be formed in any other pattern, such as in another lattice pattern or in lines. For example, shield electrodes 440 may be formed in lines as illustrated in FIG. 9 such that each line of shield electrode 440 is provided only between adjacent columns of color filters 72r, 72g and 72b. Furthermore, not limited to this, shield electrodes may be formed in lines such that each line of shield electrode 440 is provided only between adjacent rows of color filters 72r, 72g and 72b.

In the above embodiments, the gaps between adjacent lower electrodes have a uniform width. However, not limited to this, the gaps may not have a uniform width. For example, when the gaps between lower electrodes adjacent in the column direction are too narrow to form shield electrodes therein, and the gaps between lower electrodes adjacent in the row direction are wide enough to form shield electrodes therein, shield electrodes may be formed in lines in the row direction.

3. Shape of Shield Wire

In Embodiment 3 above, the shield wires are formed in a linear shape. However, not limited to this, the shield wires may be formed in an island shape, for example.

Figure 10A:
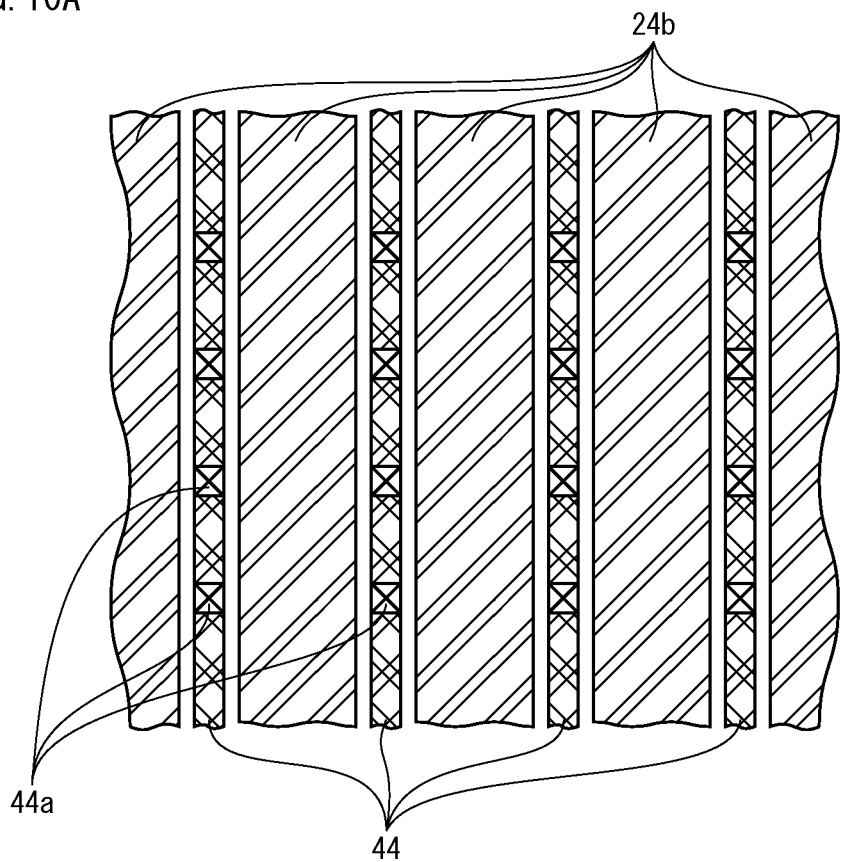
FIGS. 10A and 10B are diagrams for explaining a solid-state imaging apparatus of a modification.
Figure 10B:
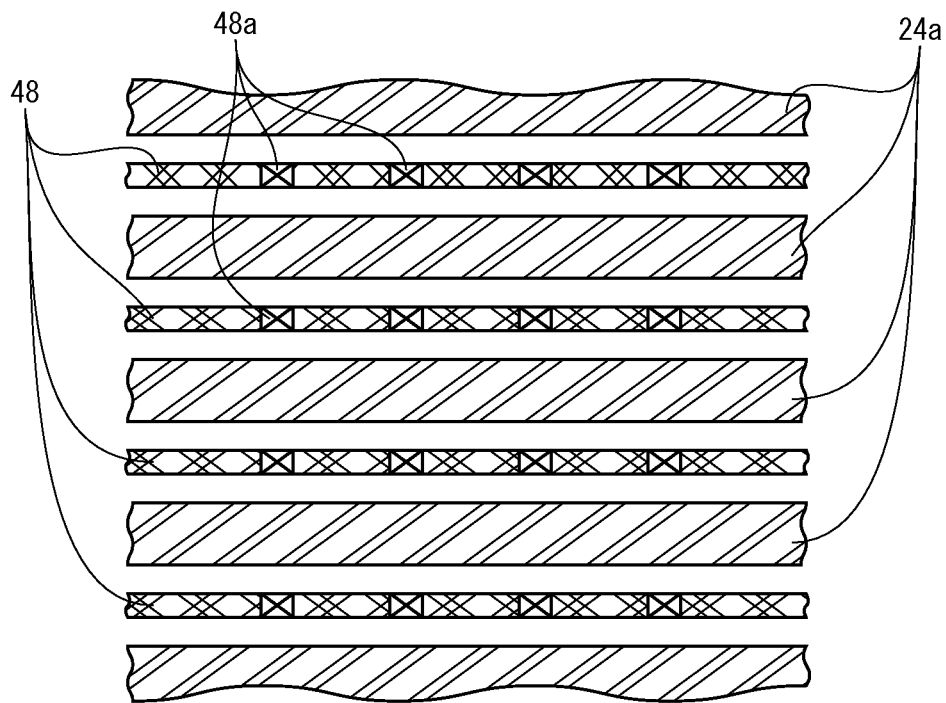
Figure 11:
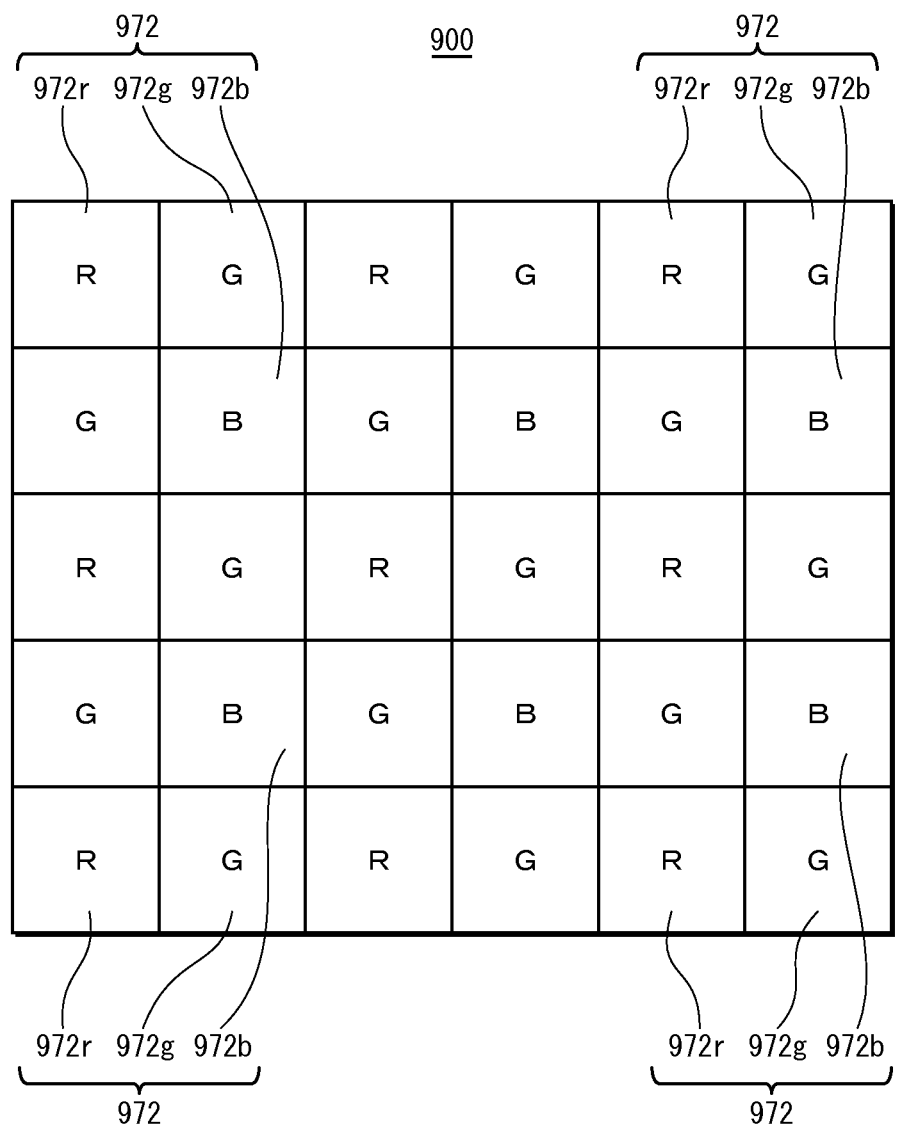
FIG. 11 is a diagram for explaining the structure of a conventional solid-state imaging apparatus.

In that case, as illustrated in FIGS. 10A and 10B, a shield wire 44 may be provided between each pair of adjacent linear wires 24b, and a shield wire 48 may be provided between each pair of adjacent linear wires 24a. Further, contacts 44a may be formed in each shield wire 44, and contacts 48a may be formed in each shield wire 48. This allows for shield wires formed in an island shape to be provided, and the shield wires 44 and 48 to have a fixed potential.

4. Shield Electrode

In the above embodiments, the shield electrode and the lower electrodes are made of the same material. However, not limited to this, the shield electrode and the lower electrodes may be made of different materials. In that case, the shield electrode and the lower electrodes may be manufactured in different steps. This allows for the respective mask patterns to have more room, making it possible to form the shield electrode to extend through a narrow gap between adjacent lower electrodes.

5. Substrate

In the above embodiments, an n-type silicon substrate is used as the substrate. However, not limited to this, a p-type silicon substrate may be used, for example. When a p-type silicon substrate is used, it is preferable to form a deep n-type well layer below a p-type well layer to electrically separate the p-type silicon substrate from the p-type well layer.

Furthermore, the substrate may be any type of substrate as far as an electronic circuit can be provided thereon. The substrate may be, for example, a glass substrate or a quartz substrate.

6. Upper Electrode

In the above embodiments, the upper electrode is made of ITO. However, not limited to this, the upper electrode may be made of, for example, indium oxide, tin oxide, FTO (Fluorine-doped Tin Oxide), zinc oxide, or AZO (Aluminum-doped Zinc Oxide). It is preferable that the material of the upper electrode can be formed as a film by a film forming apparatus, an EB deposition apparatus, or a pulsed laser deposition apparatus.

The upper electrode preferably has at least 60% of, and more preferably at least 80% of light transmittance at the photoelectric conversion peak absorption wavelength of the photoelectric conversion film of light transmittance. Furthermore, the applicable range of the surface electrical resistance of the upper electrode varies depending on whether the charge storing/transferring/reading units have the CCD structure or the CMOS structure. When the charge storing/transferring/reading units have the CMOS structure, the applicable range of the surface electrical resistance of the upper electrode is preferably at most 10,000 $\Omega$/sq, and more preferably at most 1,000 $\Omega$/sq. When the charge storing/transferring/reading units have the CCD structure, the applicable range of the surface electrical resistance of the upper electrode is preferably at most 1,000 $\Omega$/sq, and more preferably at most 100 $\Omega$/sq.

7. Structure of Photoelectric Conversion Film

In the above embodiments, an organic photoconductive film is used as the photoelectric conversion film. However, not limited to this, an inorganic photoconductive film or a mixture of organic and inorganic materials may be used as the photoelectric conversion film. The inorganic photoconductive film is more resistant, than the organic photoconductive film, to characteristic deterioration that would be caused by water or oxygen having penetrated into the photoelectric conversion film over time.

Furthermore, the photoelectric conversion film may be made of a compound semiconductor such as amorphous silicon or gallium arsenide. In that case, the wavelength dependency of the absorption coefficient of silicon or gallium arsenide can be used for the photoelectric conversion film, and the color separation is performed in the depth direction thereof. A photoelectric conversion film made of a compound semiconductor can be formed by, for example, the plasma CVD method or the MO (Metal Organic) CVD method.

8. Others

In the above embodiments, a positive bias voltage is applied to the upper electrode. However, the present invention is not limited to this structure. For example, a negative bias voltage may be applied to the upper electrode. In that case, charges generated by the photoelectric conversion film move to the lower electrodes, and positive holes move to the upper electrode.

The structure of the solid-state imaging apparatus of the present invention is not limited to the structures described in the embodiments and modifications above, but is modifiable and applicable in various ways unless such modifications and applications depart from the scope of the present invention. Furthermore, the processing steps described in the embodiments and modifications above may be replaced with other equivalent processing steps within the scope of the technical concept of the present invention. Furthermore, the steps may be changed in order, or the types of materials may be changed.

[Industrial Applicability]

The solid-state imaging apparatus of the present invention is useful as an imaging apparatus for use in a digital still camera, digital video camera, surveillance camera, vehicle-mounted camera or the like.

[Reference Signs List]

10, 910 semiconductor substrate
16, 916 charge storing unit
18, 918 signal reading unit
20, 920 insulating film
22, 24, 24a, 24b wire
42, 44, 24d, 26d, 26e shield wire
30 lower electrode
40, 440 shield electrode
50, 950 photoelectric conversion film
60, 960 upper electrode
70, 970 protection film
72, 72r, 72g, 72b, 972, 972r, 972g, 972b color filter
74, 974 micro lens
100, 200, 300, 400, 500, 600, 900 solid-state imaging apparatus

The invention claimed is:

1. A solid-state imaging apparatus having a plurality of pixels, comprising:
a substrate;
a wiring layer formed on the substrate and including an insulating film and a plurality of wires;
a plurality of lower electrodes formed on the wiring layer in one-to-one correspondence with the plurality of pixels;
a photoelectric conversion film formed covering the plurality of lower electrodes;
a light-transmissive upper electrode formed on the photoelectric conversion film;
a shield electrode between a pair of adjacent lower electrodes among the plurality of lower electrodes, the shield electrode having a fixed potential and being electrically insulated from the plurality of lower electrodes, and
a shield wire, between a pair of adjacent wires among the plurality of wires, having a fixed potential, being electrically insulated from the plurality of wires, and being electrically connected to the shield electrode.

2. The solid-state imaging apparatus of claim 1, wherein the shield electrode is made of the same material as that of the plurality of lower electrodes.

3. The solid-state imaging apparatus of claim 1, wherein the shield wire is made of the same material as that of the plurality of wires.

4. The solid-state imaging apparatus of claim 1, wherein the potential of the shield electrode is set to an intermediate potential between a potential of the upper electrode and a potential of each of the plurality of lower electrodes.

5. The solid-state imaging apparatus of claim 1 further comprising:
a power wire commonly supplying power to the plurality of pixels,
wherein the shield electrode is electrically coupled to the power wire.

6. The solid-state imaging apparatus of claim 1, wherein the plurality of lower electrodes are arranged in a matrix two-dimensionally, and the shield electrode between the pair of adjacent lower electrodes is a part of one lattice-patterned shield electrode in a plan view for surrounding the plurality of lower electrodes.

7. A solid-state imaging apparatus having pixels arranged in matrix, comprising:
a substrate;
a wiring layer, on the substrate, including an insulating film and wires;
lower electrodes, in or on the wiring layer, disposed in matrix to correspond to the pixels, respectively;
a photoelectric conversion film covering the lower electrodes;
a light-transmissive upper electrode on the photoelectric conversion film;
shield electrodes each disposed between adjacent two lower electrodes in cross-sectional view so that the lower electrodes and the shield electrodes are disposed alternately, the shield electrodes having a fixed potential and being electrically insulated from any of the lower electrodes; and
shield wires, in the wiring layer and under the respective shied electrodes, electrically connected to the shield electrodes, respectively, in cross-sectional view, each shield wires having a fixed potential and being electrically insulated from any of the wires in the wiring layer.

8. The solid-state imaging apparatus of claim 7, wherein the shield electrodes are made of the same material as that of the lower electrodes.

9. The solid-state imaging apparatus of claim 7, wherein the shield wires are made of the same material as that of the wires.

10. The solid-state imaging apparatus of claim 7, wherein the potential of the shield electrodes are set to an intermediate potential between a potential of the upper electrode and a potential of each of the lower electrodes.

11. The solid-state imaging apparatus of claim 7, further comprising a power wire commonly supplying power to the pixels, wherein
each shield electrode between immediately adjacent two lower electrodes is electrically coupled to the power wire.

12. The solid-state imaging apparatus of claim 7, wherein each shield electrode between immediately adjacent two lower electrodes is a part of one lattice-patterned shield electrode in a plan view for surrounding the lower electrodes.

13. A solid-state imaging apparatus having pixels arranged in matrix, comprising:
a substrate;
a wiring layer, on the substrate, including an insulating film and wires;
lower electrodes, in or on the wiring layer, disposed in matrix to correspond to the pixels, respectively, first lower electrodes being disposed along a first row or column of the matrix, second lower electrodes being disposed along a second row or column of the matrix immediately adjacent to, and parallel to, the first row or column;
a photoelectric conversion film covering the lower electrodes;
a light-transmissive upper electrode on the photoelectric conversion film;
a shield electrode disposed between the first row or column of the first lower electrodes and the second row or column of the second lower electrodes, the shield electrode having a fixed potential and being electrically insulated from any of the lower electrodes; and a shield wire, in the wiring layer and under the shied electrode, electrically connected to the shield electrode, the shield wire having a fixed potential and being electrically insulated from any of the wires in the wiring layer.

14. The solid-state imaging apparatus of claim 13, wherein the shield electrode is made of the same material as that of the lower electrodes.

15. The solid-state imaging apparatus of claim 13, wherein the shield wire is made of the same material as that of the wires.

16. The solid-state imaging apparatus of claim 13, wherein the potential of the shield electrode is set to an intermediate potential between a potential of the upper electrode and a potential of each of the lower electrodes.

17. The solid-state imaging apparatus of claim 13, further comprising a power wire commonly supplying power to the pixels, wherein the shield electrode is electrically coupled to the power wire.

18. The solid-state imaging apparatus of claim 13, wherein the shield electrode is a part of one lattice-patterned shield electrode in a plan view for surrounding the lower electrodes.

* * * * *